US010234516B2

(12) United States Patent
Haas et al.

(10) Patent No.: US 10,234,516 B2
(45) Date of Patent: *Mar. 19, 2019

(54) MAGNETIC FIELD SENSOR

(71) Applicant: Allegro MicroSystems, LLC, Manchester, NH (US)

(72) Inventors: David J. Haas, Concord, NH (US); Michael Gaboury, Burnsville, MN (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/989,323

(22) Filed: May 25, 2018

(65) Prior Publication Data

US 2018/0275214 A1 Sep. 27, 2018

Related U.S. Application Data

(63) Continuation of application No. 14/670,453, filed on Mar. 27, 2015, now Pat. No. 10,120,041.

(51) Int. Cl.
*G01R 33/02* (2006.01)
*G01R 33/06* (2006.01)
(Continued)

(52) U.S. Cl.
CPC .......... *G01R 33/072* (2013.01); *G01R 15/202* (2013.01); *G01R 19/0092* (2013.01);
(Continued)

(58) Field of Classification Search
CPC ........ G01R 33/00; G01R 33/02; G01R 33/06; G01R 33/07; G01R 19/00; G01R 15/20; G01R 35/00; H03F 1/02
See application file for complete search history.

(56) References Cited

U.S. PATENT DOCUMENTS 5,587,651 A * 12/1996 Berkcan ............... G01R 15/181
324/126
7,425,821 B2 * 9/2008 Monreal ................ G01R 33/07
324/117 H
(Continued)

FOREIGN PATENT DOCUMENTS

WO    WO 2005/073744 A1    8/2005

OTHER PUBLICATIONS

Notice of Allowance dated Jul. 2, 2018 for European Application No. 16712184.7; 28 Pages.
(Continued)

Primary Examiner — Neel D Shah
(74) Attorney, Agent, or Firm — Daly, Crowley, Mofford & Durkee, LLP

(57) ABSTRACT

In one aspect, a magnetic field sensor includes a chopper stabilized amplifier and a plurality of Hall-type elements in parallel and connected to the chopper stabilized amplifier. In another aspect, a magnetic field sensor includes a chopper stabilized amplifier and a plurality of Hall quad elements in parallel and connected to the chopper stabilized amplifier. In a further aspect, a current sensor has a bandwidth of 1 MHz and includes a chopper stabilized amplifier and a plurality of Hall quad elements, fabricated in silicon, in parallel and connected to the chopper stabilized amplifier.

20 Claims, 6 Drawing Sheets

(51) Int. Cl.
- *G01R 35/00* (2006.01)
- *H03F 1/02* (2006.01)
- *G01R 33/07* (2006.01)
- *G01R 15/20* (2006.01)
- *G01R 19/00* (2006.01)
- *G01R 33/00* (2006.01)

(52) U.S. Cl.
CPC ..... *G01R 33/0017* (2013.01); *G01R 33/0035* (2013.01); *G01R 33/07* (2013.01); *G01R 33/075* (2013.01)

(56) References Cited

U.S. PATENT DOCUMENTS

| | | | | |
|---|---|---|---|---|
| 7,463,016 | B2 * | 12/2008 | Shoji | G01R 15/205 324/117 R |
| 7,605,647 | B1 | 10/2009 | Romero et al. | |
| 9,612,262 | B1 * | 4/2017 | Nehmeh | G01R 15/202 |
| 2005/0230769 | A1 | 10/2005 | Lilian et al. | |
| 2007/0029999 | A1 | 2/2007 | Middelhoek et al. | |
| 2007/0247141 | A1 | 10/2007 | Pastre et al. | |
| 2007/0291112 | A1 | 12/2007 | Harris | |
| 2012/0119734 | A1 | 5/2012 | Han | |
| 2013/0179115 | A1 | 7/2013 | Friedrich et al. | |
| 2013/0214774 | A1 | 8/2013 | Cesaretti et al. | |
| 2014/0132257 | A1 | 5/2014 | Sugano et al. | |
| 2014/0210458 | A1 | 7/2014 | Ausserlechner | |
| 2016/0282425 | A1 | 9/2016 | Haas et al. | |

OTHER PUBLICATIONS

J.-B. Kammerer et al., "A Hall Effect Sensors Network Insensitive to Mechanical Stress;" Sensors, 2004; Proceedings of the IEEE; Oct. 24-27, 2004; 4 Pages.

Mario Motz et al., "A Chopped Hall Sensor with Small Jitter and Programmable "True Power-On" Function;" Proceedings of the IEEE Journal of Solid-State Circuits, vol. 40, No. 7; Jul. 2005; 8 Pages.

Zoran B. Randjelovic et al., "Highly Sensitive Hall Magnetic Sensor Microsystem in CMOS Technology;" Proceedings of the IEEE Journal of Solid-State Circuits, vol. 37, No. 2; Feb. 2002; 9 Pages.

R. Steiner et al., "Double-Hall Sensor with Self-Compensated Offset;" Proceedings of the IEEE—International Electron Devices Meeting (IEDM); Dec. 10, 1997; 4 Pages.

J.C. van der Meer et al., "CMOS Quad Spinning-Current Hall-Sensor System for Compass Application;" Sensors, 2004; Proceedings of the IEEE; Oct. 24-27, 2004; 4 Pages.

PCT International Search Report and Written Opinion dated Jul. 15, 2016 for International Application No. PCT/US2016/023656; 17 pages.

PCT International Preliminary Report on Patentability dated Oct. 12, 2017 for International Application No. PCT/US2016/023656; 13 pages.

Office Action dated Dec. 28, 2016 for U.S. Appl. No. 14/670,453, 17 pages.

Response to Office Action dated Jan. 23, 2017 for U.S. Appl. No. 14/670,453, 11 pages.

Final Office Action dated May 8, 2017 for U.S. Appl. No. 14/670,453, 18 pages.

Response to Office Action dated Aug. 7, 2017 for U.S. Appl. No. 14/670,453, 11 pages.

Office Action dated Oct. 20, 2017 for U.S. Appl. No. 14/670,453, 20 pages.

Response to Office Action dated Dec. 19, 2017 for U.S. Appl. No. 14/670,453, 14 pages.

Notice of Allowance dated Apr. 6, 2018 for U.S. Appl. No. 14/670,453, 13 pages.

European Response to Written Opinion dated Apr. 10, 2018 for European Application No. 16712184.7, 17.

European Decision to Grant dated Oct. 18, 2018 for European Application No. 16712184.7; 2 Pages.

* cited by examiner

US 10,234,516 B2

MAGNETIC FIELD SENSOR

RELATED APPLICATIONS

This present application is continuation of U.S. patent application Ser. No. 14/670,453, titled "Magnetic Field Sensor" filed Mar. 27, 2015, which is incorporated herein by reference in its entirety for any and all purposes.

BACKGROUND

Various types of magnetic field sensing elements are known, including Hall effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field, or, in some embodiments, fluctuations of the magnetic field associated with the magnet. In the presence of a moving ferromagnetic object, the magnetic field signal sensed by the magnetic field sensor varies in accordance with a shape or profile of the moving ferromagnetic object.

Magnetic field sensors are often used to detect movement of features of a ferromagnetic gear, such a gear tooth and/or gear slots. A magnetic field sensor in this application is commonly referred to as a "gear tooth" sensor.

In some arrangements, the gear is placed upon a target object, for example, a camshaft in an engine, thus it is the rotation of the target object (e.g., camshaft) that is sensed by detection of the moving features of the gear. Gear tooth sensors are used, for example, in automotive applications to provide information to an engine control processor for ignition timing control, fuel management, wheel speed and other operations.

SUMMARY

In one aspect, a magnetic field sensor includes a chopper stabilized amplifier and a plurality of Hall-type elements in parallel and connected to the chopper stabilized amplifier. In another aspect, a magnetic field sensor includes a chopper stabilized amplifier and a plurality of Hall quad elements in parallel and connected to the chopper stabilized amplifier. In a further aspect, a current sensor has a bandwidth of 1 MHz and includes a chopper stabilized amplifier and a plurality of Hall quad elements, fabricated in silicon, in parallel and connected to the chopper stabilized amplifier.

DESCRIPTION OF THE DRAWINGS

The foregoing features of the invention, as well as the invention itself may be more fully understood from the following detailed description of the drawings, in which.

DETAIL DESCRIPTION

Figure 1:
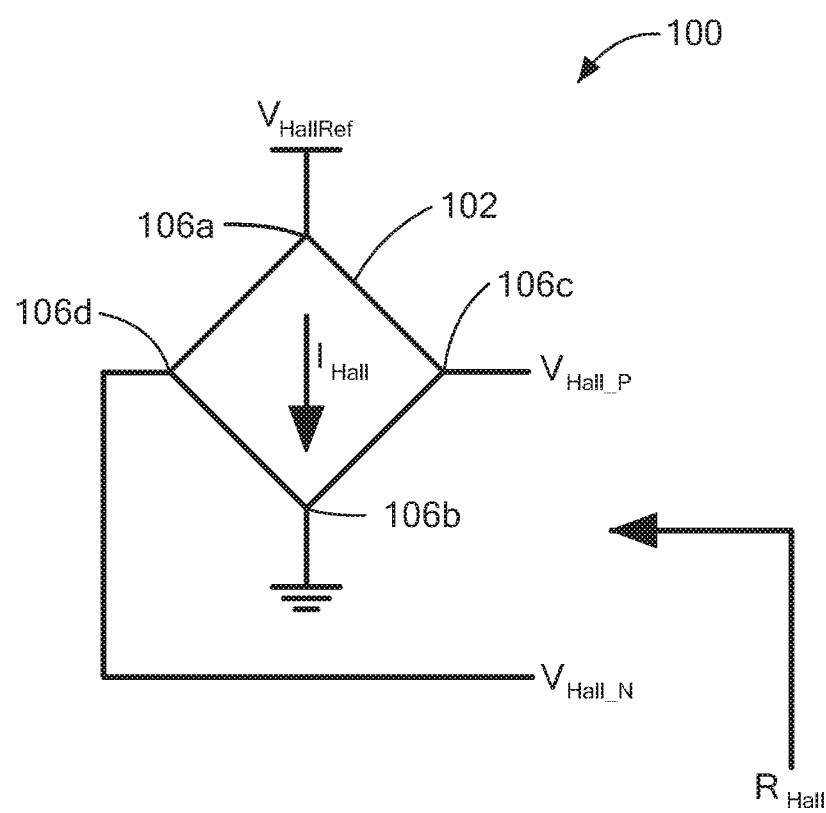
FIG. 1 is a circuit diagram of an example of a Hall effect element.

Described herein are techniques to fabricate a magnetic field sensor. In one example, the techniques described herein are used to reduce the time constant of a Hall effect sensor, which allows for a Hall amplifier to be chopped. Typically, one chops the Hall plate by varying the power and signal leads in order to place the Hall offset at a higher frequency, where it can be filtered out. However, as described herein, a plurality of Hall quad elements in parallel reduces the offset which then can be trimmed out. The techniques described herein result in a low offset solution with higher bandwidth than other standard Hall chopping solutions, which enables higher bandwidth sensing with minimal increase in offset drift over temperature and stress. In one particular example, the bandwidth of a silicon-based device (e.g., a current sensor) using the techniques described herein increases from about 250 kHz to 1 MHz because chopping may now be performed at about 8 MHz or 10 MHz to eliminate offsets.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Referring to FIG. 1, in one example, a Hall effect element 100 includes a single Hall plate 102. The Hall plate 102 is connected to a voltage source, $V_{HallRef}$ at a first contact 106a and the Hall plate 102 is connected to ground at a second contact 106b to generate a current, $I_{Hall}$, that flows through the Hall plate 102 (i.e., current flows from the first contact 106a to the second contact 106b). The resistance of the Hall plate 102 is $R_{Hall}$. In other examples, the contact 106a is connected to a current source that generates the current, $I_{Hall}$.

Figure 2:
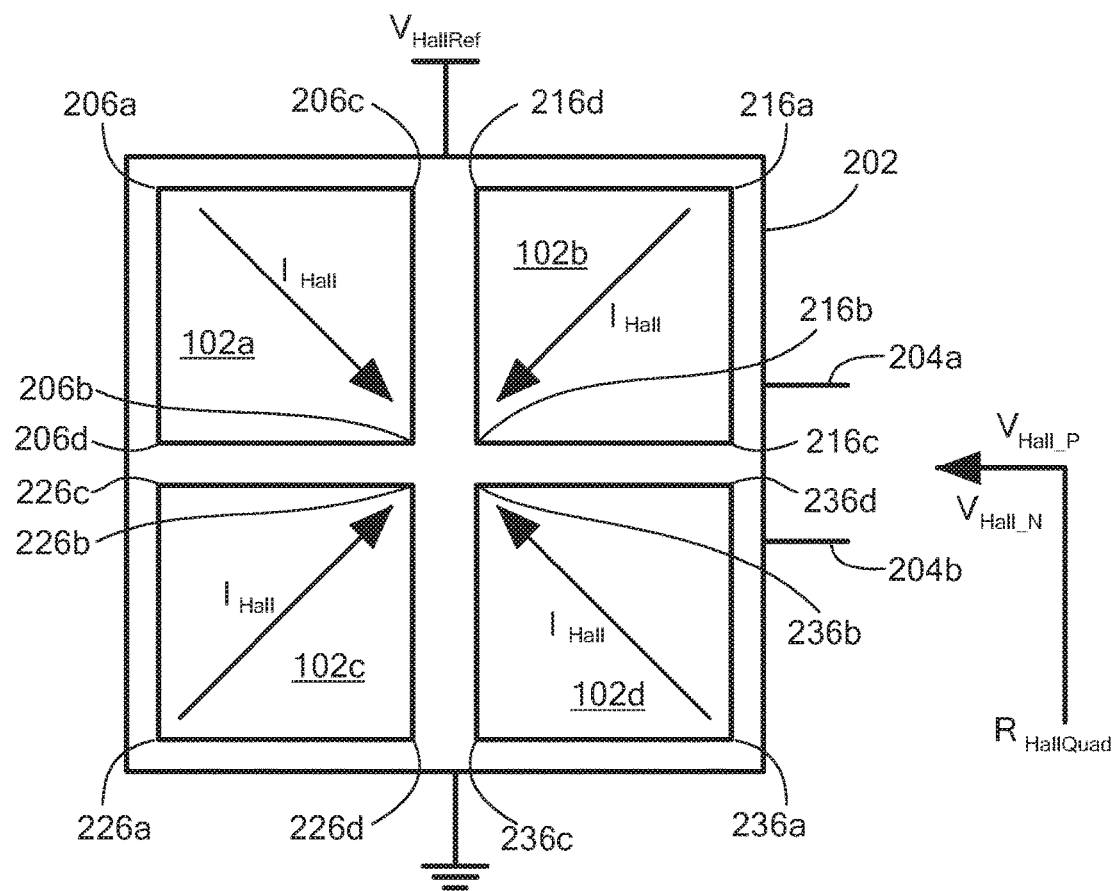
FIG. 2 is a circuit diagram of an example of a hall quad element.

When the Hall plate 102 is exposed to a magnetic field a voltage, $V_{Hall\_P}$, is generated at a third contact 106c and a voltage, $V_{Hall\_N}$, is generated at the fourth contact 106d to produce an output voltage of the single Hall plate 102 equal to $V_{out}$ or $V_{Hall\_P}-V_{Hall\_N}$. In one example, the Hall plate 102 is a rectangular-shaped plate. In one particular example, the Hall plate 102 is a square-shaped plate. In a further example, the Hall plate is a cross-shaped plate. Referring to FIG. 2, sometimes single Hall plates have DC offsets (sometimes referred to herein as Hall offsets). That is, with a zero magnetic field, $V_{out}$ is nonzero. The offset may also change with temperature or stress. To eliminate these DC offsets, it is common to use four single Hall plates each rotated in quadrature (e.g., each Hall plate is rotated at least 90° from each other) to form a Hall quad element.

In one example, a Hall quad element 202 includes Hall plates 102a-102d. Each of the Hall plates 102a-102d are substantially the same in shape, size and functionality. The Hall quad element 202 has a first output terminal 204a and a second output terminal 204b.

The Hall plate 102a includes a first contact 206a, a second contact 206b, a third contact 206c and a fourth contact 206d. The Hall plate 102b includes a first contact 216a, a second contact 216b, a third contact 216c and a fourth contact 216d. The Hall plate 102c includes a first contact 226a, a second contact 226b, a third contact 226c and a fourth contact 226d. The Hall plate 102d includes a first contact 236a, a second contact 236b, a third contact 236c and a fourth contact 236d.

A voltage source, $V_{HallRef}$ is connected to the outermost corners of the plates 102a-102d. That is, the voltage source, $V_{HallRef}$ is connected to the first contact 206a of the plate 102a, the first contact 216a of the plate 102b, the first contact 226a of the plate 102c and the first contact 236a of the plate 102d.

The ground is tied to the innermost corners of the plates 102a-102d. That is, the ground is connected to the second contact 206b of the plate 102a, the second contact 216b of the plate 102b, the second contact 226b of the plate 102c and the second contact 236b of the plate 102d.

When the Hall quad element 202 is exposed to a magnetic field a voltage, $V_{Hall\_P}$, is generated at the third contact of each of the plates 102a-102d. The third contacts of each of the plates 102a-102d are connected to the first output terminal 204a. That is, the first output terminal 204a is connected to the third contact 206c of the plate 102a, the third contact 216c of the plate 102b, the third contact 226c of the plate 102c and the third contact 236c of the plate 102d. The voltage at the first output terminal is equal to $V_{Hall\_P}$.

When the Hall quad element 202 is exposed to a magnetic field a voltage, $V_{Hall\_N}$, is also generated at the fourth contact of each of the plates 102a-102d. The fourth contacts of each of the plates 102a-102d are connected to the second output terminal 204b. That is, the second output terminal 204b is connected to the fourth contact 206d of the plate 102a, the fourth contact 216d of the plate 102b, the fourth contact 226d of the plate 102c and the fourth contact 236d of the plate 102d. The voltage at the second output terminal is equal to $V_{Hall\_N}$.

The voltage output of the Hall quad element 202 is equal to $V_{Hall\_P}-V_{Hall\_N}$. The resistance of the Hall quad element 202 is equal to $R_{HallQuad}=R_{Hall}/4$.

Figure 3:
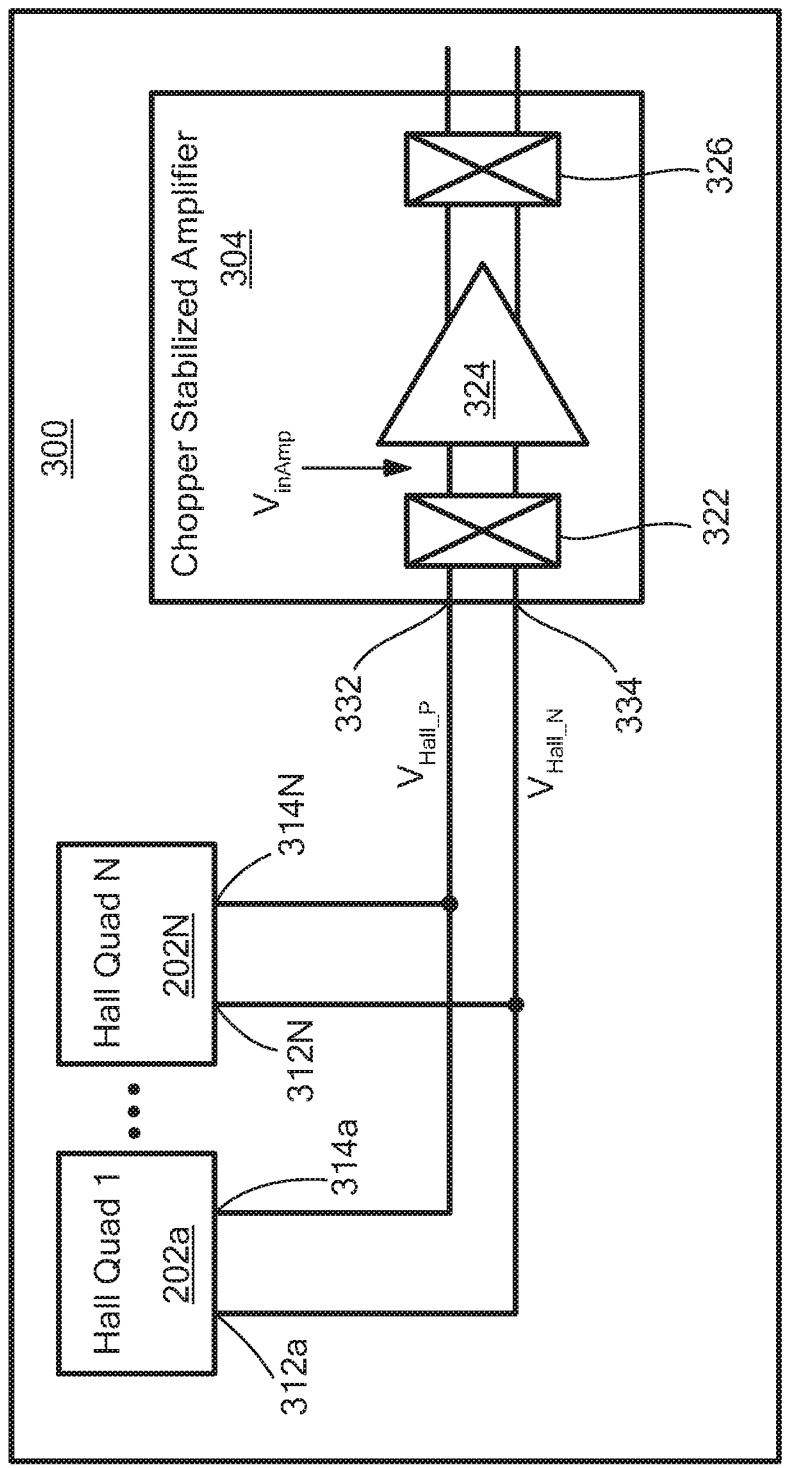
FIG. 3 is block diagram of an example of a magnetic field sensor.

Referring to FIG. 3, a magnetic field sensor 300 (e.g., a Hall effect current sensor) includes Hall quad elements in parallel (e.g., Hall quad element 202a, . . . , a Hall quad element 202N) and a chopper stabilized amplifier 304. The chopper stabilized amplifier 304 includes a first input terminal 332 and a second input terminal 334. The chopper stabilized amplifier 304 also includes a switch 322, a front end Hall amplifier 324 and a switch 326.

The Hall quad element 202a includes a first output terminal 312a and a second output terminal 314a and the Hall quad element 202N includes a first output terminal 312N and a second output terminal 314N. When exposed to a magnetic field the first output terminals (312a-312N) have a voltage, $V_{Hall\_P}$, and the second output terminals have a voltage, $V_{Hall\_N}$. The first output terminals (312a-312N) are connected together to the input terminal 332 of the chopper stabilized amplifier 304 and the second output terminals (314a-314N) are connected to the second input terminal 334 of the chopper stabilized amplifier 304.

By placing the Hall quad elements 202a-202N in parallel, the combined Hall offset (the net offset of all the Hall quad elements) is further reduced. Putting the Hall quad elements 202a-202N in parallel also allows for keeping the quad Hall plate symmetry for each Hall quad element. The advantage of a quad Hall plate is that it cancels out stress induced offsets. This leaves just the construction based offsets (misalignment of contacts, and so forth . . . ) to trim out. Chopping a single Hall plate removes both sources of offset. If chopping is not used, it is important to use quad Hall plates, as stress based offsets can be unpredictable over temperature and lifetime. By getting rid of those, then just construction based offsets are trimmed out, which will be relatively consistent or predictable over temperature and lifetime.

With a lower Hall resistance and higher Hall capacitance, the front end amplifier 324 can be chopped at a high frequency. This is based on the settling time of the total Hall plate resistance and the parallel combination of the Hall capacitance and input capacitance of the front end Hall amplifier 324, as well as the ratio of the amplifier capacitance to the Hall capacitance. Otherwise, the offset of the front end Hall amplifier 324 could dominate the offset of the system.

As will be described further herein, one can asymptotically approach the native Hall quad element time constant ($R_{HallQuad}*C_{HallQuad}$), which is the minimum limit, but the effect of the input capacitance of the amplifier, $C_{InAmp}$, is reduced by the increase in the number of Hall quad elements.

The voltage received by the front end Hall amplifier 324 is equal to:

$$V_{InAmp} = (V_{Hall\_P} - V_{Hall\_N}) * \left(1 - e^{\frac{t}{R_{Hall\_Total}*(C_{InAmp}+C_{HallTotal})}}\right),$$

where

-continued $$R_{HallTotal} = \frac{1}{N} * R_{HallQuad},$$

$$C_{HallTotal} = N * C_{HallQuad}$$

and the time constant is equal to:

$$R_{HallTotal} * (C_{InAmp} + C_{HallTotal}) = R_{HallQuad} * C_{HallQuad} + \frac{1}{N} * R_{HallQuad} * C_{InAmp},$$

where N is equal to the number of Hall quad elements, $C_{InAmp}$ is the input capacitance of the front end Hall amplifier 324, $C_{HallTotal}$ is the capacitance of the Hall quad elements and $R_{HallTotal}$ is the resistance of the Hall quad elements so that adding Hall quad elements in parallel reduces the time constant R*C towards being equal to $R_{HallQuad}*C_{HallQuad}$ (i.e., as N gets larger). At the same time, the ratio of the Hall quad capacitance, $C_{QuadTotal}$, to the input capacitance, $C_{InAmp}$, goes up. When the front end amplifier 324 is chopped, the charge on the input capacitor goes into the Hall capacitance, $C_{HallTotal}$, causing a voltage step that has to settle out at the time constant above. As the ratio of capacitances increases, the step voltage decreases, meaning one does not have to wait as long for the error to go below the desired accuracy. This means one can chop at a higher frequency than what the raw Hall plate can be chopped at, leading to a faster bandwidth part. Also, at the extreme, as described herein, the voltage step is so small that the chopping frequency is actually limited by something else in the circuitry and not the accuracy of this settling from chopping.

In one particular example, the time constant is about 5 ns, where $R_{HallQuad}$ has an effective source resistance of about 4.4 kohm and $C_{HallQuad}$ is about 0.8 pF and $C_{InAmp}$ is about 1.1 pF.

In one particular example, three Hall quad elements are disposed in parallel and inside a conduction loop (e.g., conduction loop in FIG. 4) of a current sensor in order to get the best signal to noise ratio. The front end Hall amplifier 324 would then be chopped in order to get rid of the offsets in the front end Hall amplifier 324.

In another example, epitaxial resistors are disposed in parallel with the Hall quad elements in order to reduce the offsets and time constant. However, there is a trade-off between area and signal to noise. That is, using epitaxial resistors occupy a smaller area, but the signal-to-noise is worse.

Figure 4:
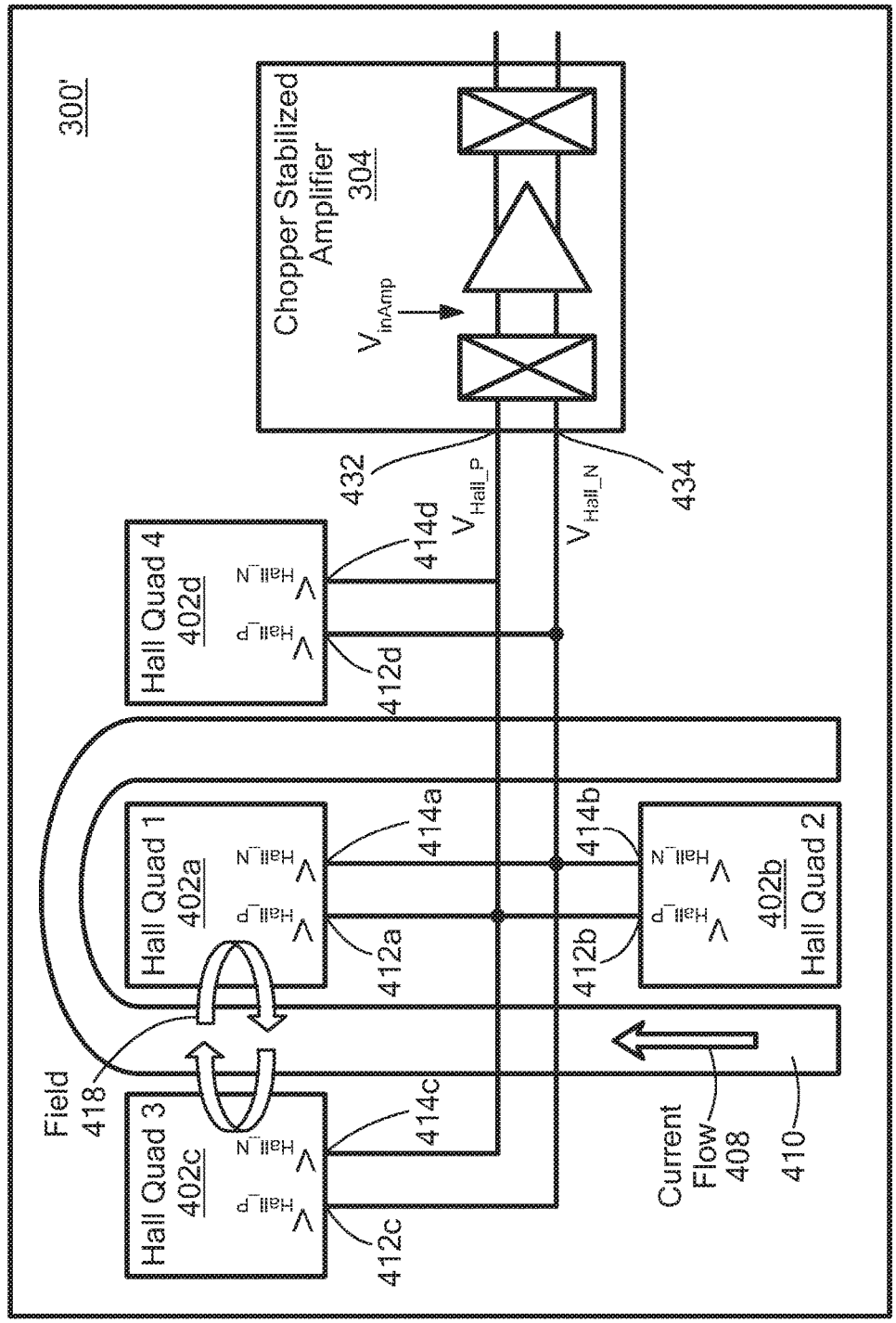
FIG. 4 is block diagram of another example of a magnetic field sensor.

Referring to FIG. 4, in another embodiment, a magnetic field sensor 300 (e.g., a Hall effect current sensor) may include parallel Hall quad elements (e.g., a Hall quad element 402a, a Hall quad element 402b, a Hall quad element 402c and a Hall quad element 402d). The Hall quad elements 402a-402d include a first contact 412a-412d and second contact 414a-414d, respectively. When exposed to a magnetic field (e.g., a magnetic field 418), the first contacts 412a-412d have a voltage, $V_{Hall\_P}$ and the second contacts 414a-414d have a voltage, $V_{Hall\_N}$. In this configuration an even number of Hall quad elements are disposed on opposite sides of a current conduction loop 410. For example, Hall quad elements 402a, 402c are on opposites of a conduction loop 410 than the Hall quad elements 410c, 410d. This configuration enables detection of the magnetic field 418 generated in the conduction loop 410 by the current flow 408 and cancels any external field by connecting the Hall quad elements 410c, 410d on opposite sides of the current loop 410 in opposite polarity. That is, the first output terminals 412a, 412b of the Hall quad elements 402a, 402b are connected to the second output terminals 414c, 414d of the Hall quad elements 402c, 402d and the second output terminals 414a, 414b of the Hall quad elements 402a, 402b are connected to the first output terminals 412c, 412d of the Hall quad elements 402c, 402d. Even though FIG. 4 depicts two Hall quad elements on each side of the loop 410, one of ordinary skill in the art would recognize that the number of Hall quad elements on each side is not limited to two.

Figure 5:
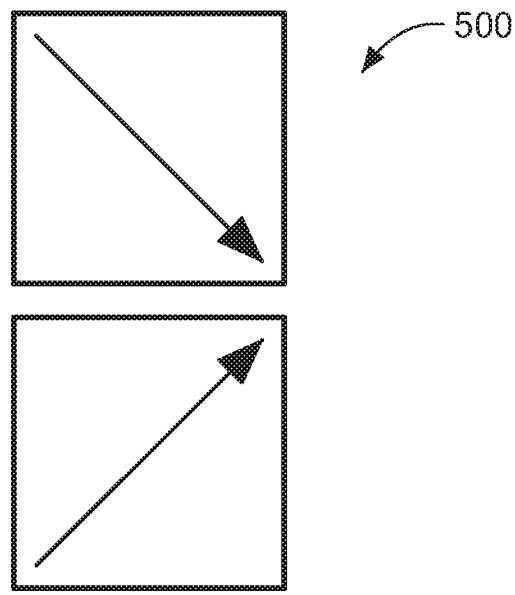
FIG. 5 is a block diagram of a dual Hall element.
Figure 6:
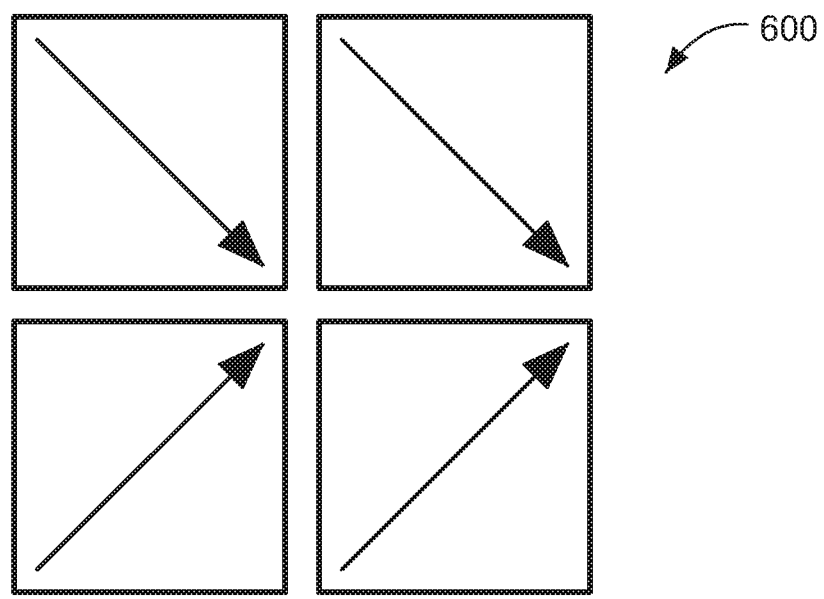
FIG. 6 is a block diagram of two dual Hall elements.
Figure 7:
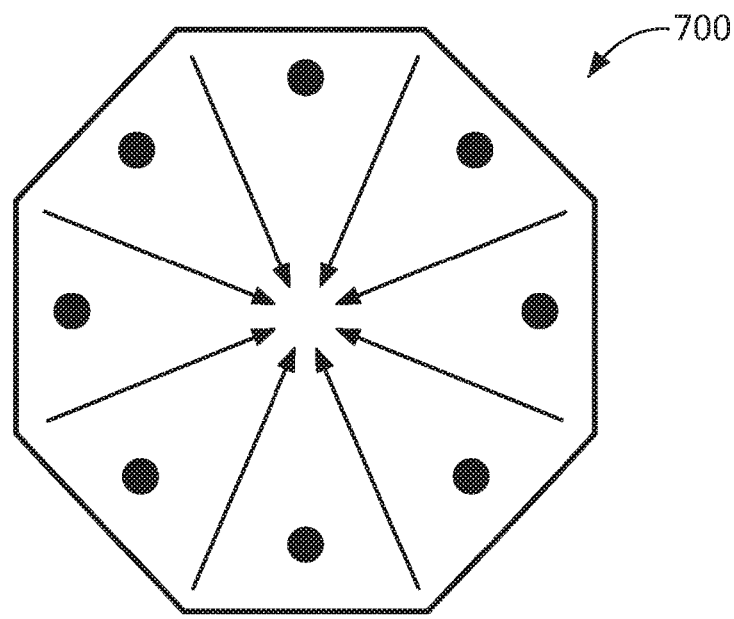
FIG. 7 is a block diagram of a octal Hall element.
Figure 8:
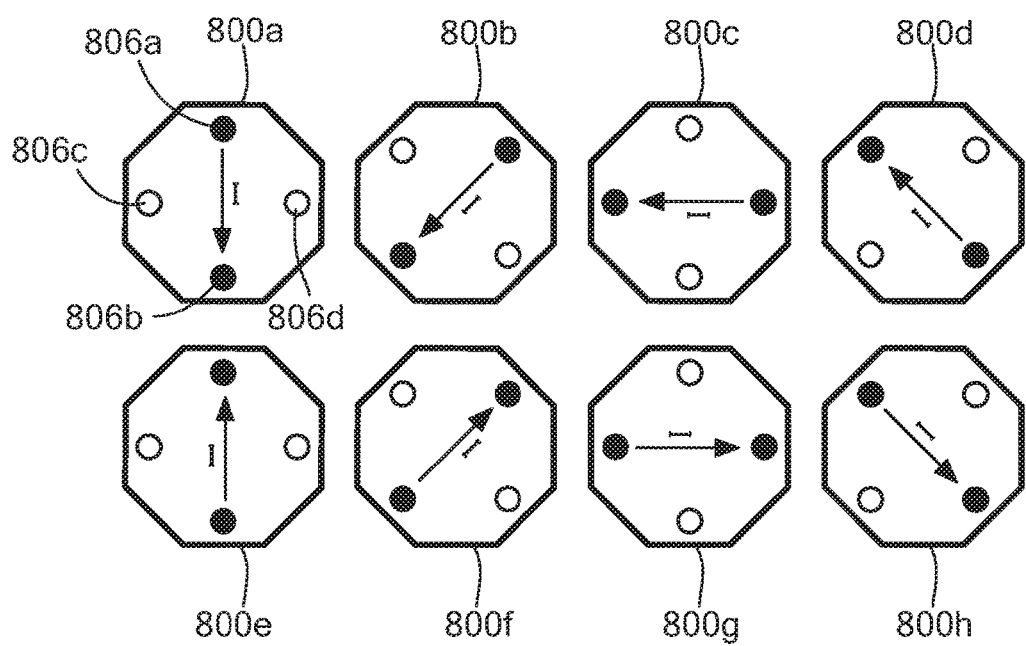
FIG. 8 is a block diagram of different configurations of the octal Hall element.

One of ordinary skill in the art would recognize that the techniques described herein are not limited to Hall quad elements; but rather, the Hall quad elements may be replaced by other Hall-type elements. For example, a Hall dual element 500 (FIG. 5) may be used. In other embodiments, two dual elements 600 may be used (FIG. 6). In still further embodiments a Hall octal element 700 may be used (FIG. 7). As shown in FIG. 8, using a Hall octal element, the Hall voltage is measured eight times, one for each configuration 800a-800g. For example, in the configuration 800a, current flows from contact 806a-806b and the Hall voltage is measured between contacts 806c-806d. When extended to the remaining configurations 800b-800g stress or other effects on the die are averaged out. In other embodiments, other even-sided Hall-type elements than the 4-sided (Hall quad element) and 8-sided (Hall octal element) may be used such as 6-sided, 10-sided, 12-sided and so forth. Though not as preferred as even-sided Hall-type elements, odd-sided Hall-type elements may also be used. In still further embodiments, another Hall-type element that may be used is a circular vertical Hall.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
   a chopper stabilized amplifier; and
   a plurality of at least four Hall-type elements electrically connected in parallel to each other and electrically connected to the chopper stabilized amplifier;
   wherein the at least four Hall-type elements are disposed in a configuration to include an equal number of at least two Hall-type elements disposed on each side of a conduction loop; and
   wherein the at least two Hall-type elements disposed inside the conduction loop are disposed in an opposite polarity than the at least two Hall type elements disposed outside the conduction loop.

2. The magnetic field sensor of claim 1, wherein the conduction loop has a shape comprising at least one curve.

3. The magnetic field sensor of claim 1 wherein the plurality of at least four Hall-type elements comprises at least one of a Hall quad element, a Hall dual element, or a Hall octal element.

4. The magnetic field sensor of claim 1, wherein the at least four Hall-type elements are fabricated in silicon and wherein the bandwidth of the magnetic field sensor is approximately 1 MHz.

5. A magnetic field sensor comprising:
a chopper stabilized amplifier; and
a plurality of at least four Hall quad elements electrically connected in parallel to each other and electrically connected to the chopper stabilized amplifier;
wherein the plurality of at least four Hall quad elements are disposed in a configuration to include an equal number of at least two Hall quad elements on each side of a conduction loop;
wherein the at least two Hall quad elements disposed inside the conduction loop are disposed in an opposite polarity than the at least two Hall quad elements disposed outside the conduction loop.

6. The magnetic field sensor of claim 5, wherein the conduction loop has a shape comprising at least one curve.

7. The magnetic field sensor of claim 5, wherein at least one Hall quad element of the plurality of at least four Hall quad elements comprises a rectangular-shaped Hall plate.

8. The magnetic field sensor of claim 7, wherein the at least one Hall quad element comprises a square-shaped Hall plate.

9. The magnetic field sensor of claim 5, wherein at least one Hall quad element of the plurality of at least four Hall quad elements comprises a cross-shaped Hall plate.

10. The magnetic field sensor of claim 5, wherein a Hall quad element of the plurality of at least four Hall quad elements comprises four Hall plates of substantially similar shape.

11. The magnetic field sensor of claim 5, wherein the plurality of at least four Hall quad elements are fabricated in silicon.

12. The magnetic field sensor of claim 11, wherein a bandwidth of the magnetic field sensor is approximately 1 MHz.

13. The magnetic field sensor of claim 5, wherein a resistance of a Hall quad element of the plurality of at least four Hall quad elements is approximately 4.4 kΩ and a capacitance of the Hall quad element is approximately 0.8 pF; and wherein an input capacitance of the chopper stabilized amplifier is approximately 1.1 pF.

14. A current sensor comprising:
a chopper stabilized amplifier; and
a plurality of at least four Hall quad elements electrically connected in parallel to each other and electrically connected to the chopper stabilized amplifier, the plurality of Hall quad elements fabricated in silicon;
wherein the current sensor has a bandwidth of 1 approximately MHz;
wherein the plurality of at least four Hall quad elements are disposed in a configuration to include an equal number of at least two Hall quad elements disposed on each side of a conduction loop; and
wherein the at least two Hall quad elements disposed inside the conduction loop are disposed in an opposite polarity than the at least two Hall quad elements disposed outside the conduction loop.

15. The current sensor of claim 14, wherein the conduction loop has a shape comprising at least one curve.

16. The current sensor of claim 14, wherein a Hall quad element of the at least four Hall quad elements comprises a rectangular-shaped Hall plate.

17. The current sensor of claim 14, wherein a Hall quad element of the at least four Hall quad elements comprises a square-shaped Hall plate.

18. The current sensor of claim 14, wherein a Hall quad element of the at least four Hall quad elements comprises a cross-shaped Hall plate.

19. The current sensor of claim 14, wherein a Hall quad element of the at least four Hall quad elements comprises four Hall plates of substantially similar shape.

20. The current sensor of claim 14, wherein a resistance of a Hall quad element of the at least four Hall quad elements is approximately 4.4 kohm and a capacitance of the Hall quad element is approximately 0.8 pF; and wherein an input capacitance of the chopper stabilized amplifier is approximately 1.1 pF.

* * * * *